(12) United States Patent
Song et al.

(10) Patent No.: US 9,116,659 B2
(45) Date of Patent: Aug. 25, 2015

(54) SERVER

(71) Applicants: Inventec (Pudong) Technology Corporation, Shanghai (CN); INVENTEC CORPORATION, Taipei (TW)

(72) Inventors: Er-Zhen Song, Shanghai (CN); Ji-Peng Xu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 298 days.

(21) Appl. No.: 13/784,540

(22) Filed: Mar. 4, 2013

(65) Prior Publication Data

US 2014/0085804 A1 Mar. 27, 2014

(30) Foreign Application Priority Data

Sep. 21, 2012 (CN) .......................... 2012 1 0355386

(51) Int. Cl.
*H05K 5/00* (2006.01)
*H05K 7/00* (2006.01)
*G06F 1/16* (2006.01)
*G06F 1/18* (2006.01)
*G06F 1/20* (2006.01)
*H05K 7/14* (2006.01)

(52) U.S. Cl.
CPC *G06F 1/16* (2013.01); *G06F 1/183* (2013.01); *G06F 1/187* (2013.01); *G06F 1/188* (2013.01); *G06F 1/20* (2013.01); *H05K 7/1487* (2013.01)

(58) Field of Classification Search
CPC ......... G06F 1/189; G06F 1/184; G06F 1/183; G11B 33/142
USPC ................ 361/679.46–679.51, 679.01–679.4
See application file for complete search history.

(56) References Cited

U.S. PATENT DOCUMENTS

2006/0041783 A1* 2/2006 Rabinovitz ........................ 714/6
2006/0048001 A1* 3/2006 Honda et al. ..................... 714/7
2011/0222227 A1* 9/2011 Xu et al. .................... 361/679.4

* cited by examiner

*Primary Examiner* — Jerry Wu
(74) *Attorney, Agent, or Firm* — Locke Lord LLP; Tim Tingkang Xia, Esq.

(57) ABSTRACT

A server comprises a frame, a middle plate fixed inside the frame, a vertical plate vertically erected on the middle plate and electrically connected to the middle plate, a mainframe detachably disposed inside the frame, a hard disk module and a power supply detachably disposed inside the frame. The vertical plate comprises a first electrical connector. The mainframe comprises a second electrical connector. The second electrical connector is electrically connected to the first electrical connector. The hard disk module can be detachably disposed inside the frame and electrically connected to the middle plate so that the hard disk module can transmit data to the mainframe via the middle plate and the vertical plate. The power supply is disposed below the mainframe and electrically connected to the middle plate so that the power supply can transmit electric current to the mainframe via the middle plate and the vertical plate.

8 Claims, 5 Drawing Sheets

SERVER

CROSS-REFERENCE TO RELATED APPLICATIONS

This non-provisional application claims priority under 35 U.S.C. §119(a) on Patent Application No(s). 201210355386.9 filed in China on Sep. 21, 2012, the entire contents of which are hereby incorporated by reference.

BACKGROUND OF THE INVENTION

1. Technical Field of the Invention

The present disclosure relates to a server and more particularly to a server by which internal electronic devices inside the server can be dismounted conveniently.

2. Description of the Related Art

Nowadays, the information technology is in a rapid development era, computers such as desktops or laptops are widely used by corporations and individuals to handle various tasks. As the communication technology becomes highly developed, transnational electronic commerce has already replaced regional business transaction. As a result, the electronization of corporations is becoming a development trend. Common personal computers can no longer meet the business requirements of corporations. Therefore, computer companies have developed specialized servers with different functions such as cloud computing, firewall, etc., in order to solve the problems of electronization for corporations.

A typical server comprises a frame and various electronic devices, such as power supply, motherboard, data storing and data accessing hard disk, system hard disk and fan, installed inside the frame. The dispositions of the various electronic devices are complicated and interlaced with each other as they are accommodated in a limited space inside the frame. Therefore, when maintenance personnel have to assemble the server, a tremendous amount of time and effort are required. As a result, the cost for the assembling of the server is increased relatively. Therefore, it is highly demanded for researchers to improve the disposition of the various electronic devices inside the server limited space in order to enhance the convenience of assembling the server.

SUMMARY OF THE INVENTION

A server of the present disclosure is provided to improve the disposition of various electronic devices inside the server limited space in order to enhance the convenience of assembling the server.

The server disclosed in the present disclosure comprises a frame, a middle plate, a vertical plate, a mainframe, a hard disk module and a power supply. The frame comprises a bottom plate and two lateral plates disposed by the two opposite sides of the bottom plate. The middle plate is flatly disposed on the bottom plate. The vertical plate is vertically erected on the middle plate and electrically connected to the middle plate. The vertical plate comprises at least one first electrical connector. At least one of the mainframes is detachably disposed inside the frame. The at least one mainframe comprises a second electrical connector. The second electrical connector is electrically connected to the first electrical connector. The hard disk module is detachably disposed inside the frame and electrically connected to the middle plate so that the hard disk module can transmit data to the mainframe via the middle plate and the vertical plate. The power supply is detachably disposed inside the frame. The power supply is disposed below the mainframe and electrically connected to the middle plate so that the power supply can transmit electric current to the mainframe via the middle plate and the vertical plate.

According to the server disclosed in the present disclosure, the hard disk module comprises a hard disk back-plate and a data hard disk. The data hard disk and the hard disk back-plate are electrically connected to each other. The hard disk back-plate has a third electrical connector. The middle plate has a fourth electrical connector. The third electrical connector and the fourth electrical connector are electrically connected to each other.

According to the server disclosed in the present disclosure, the hard disk back-plate is be detachably disposed and lies flat on the bottom of the frame. The detaching direction of the hard disk back-plate is opposite to that of the mainframe. The data hard disk is detachably inserted on the hard disk back-plate. The detaching direction of the data hard disk is vertical to that of the hard disk back-plate.

According to the server disclosed in the present disclosure, further comprising a hard disk frame disposed inside the frame. The data hard disk is disposed inside the hard disk frame.

According to the server disclosed in the present disclosure, the hard disk frame further comprises a fastening hole. The server further comprises a fastening element pivotally connected on the data hard disk. The data hard disk is disposed inside the hard disk frame, and the fastening element is fastened in the fastening hole.

According to the server disclosed in the present disclosure, the power supply comprises a fifth electrical connector. The middle plate comprises a sixth electrical connector. The fifth electrical connector and the sixth electrical connector are electrically connected to each other.

The server disclosed in the present disclosure further comprises a fan module disposed inside the frame. The fan module is disposed above the middle plate and electrically connected to the middle plate. The mainframe controls the fan module via the middle plate. The fan module is disposed between the mainframe and the hard disk module and can be detached from the frame along a direction away from the middle plate.

According to the server disclosed in the present disclosure, the mainframe further comprises a motherboard and a system hard disk. The system hard disk is electrically connected to the motherboard. The second electrical connector is disposed on the motherboard.

According to the server disclosed in the present disclosure, the quantity of the at least one first electrical connector is two, one of the two first electrical connectors is disposed above the other first electrical connector. The quantity of the at least one mainframe is two, the two mainframes are stacked together and electrically connected to the two first electrical connectors respectively.

According to the server disclosed in the present disclosure, the mainframe and the vertical plate are be electrically connected to each other, the power supply and the middle plate are be electrically connected to each other, as well as the hard disk back-plate and the middle plate are be electrically connected to each other via the electrical connectors. Thereby, the mainframe and the vertical plate, the power supply and the middle plate, as well as the hard disk back-plate and the middle plate are be electrically connected to each other without using cables. Therefore, the assembling time for the various elements can be shortened in order to enhance the convenience of assembling the server.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

Figure 1:
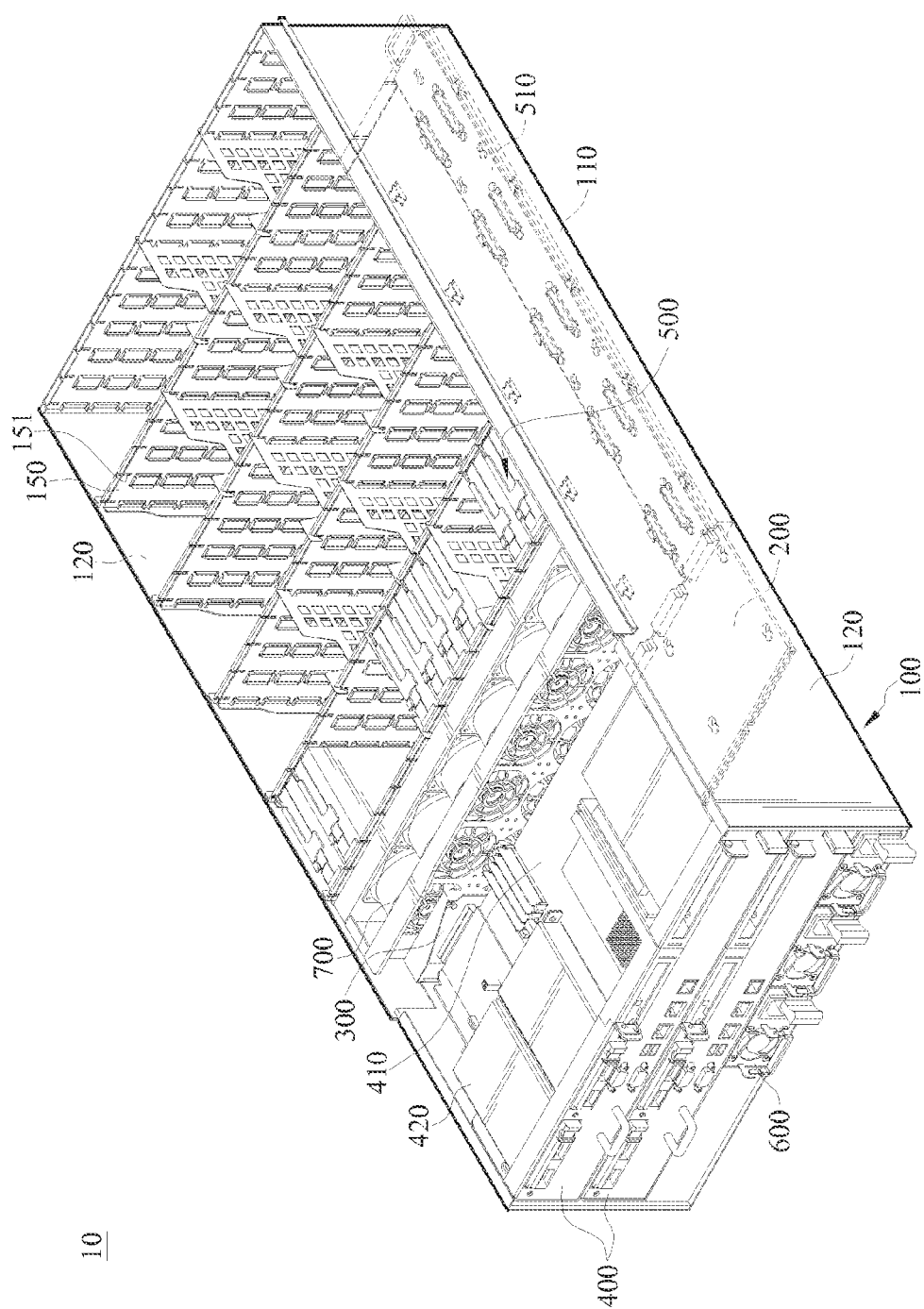
FIG. 1 is a schematic view of a server according to an embodiment of the disclosure.
Figure 2A:
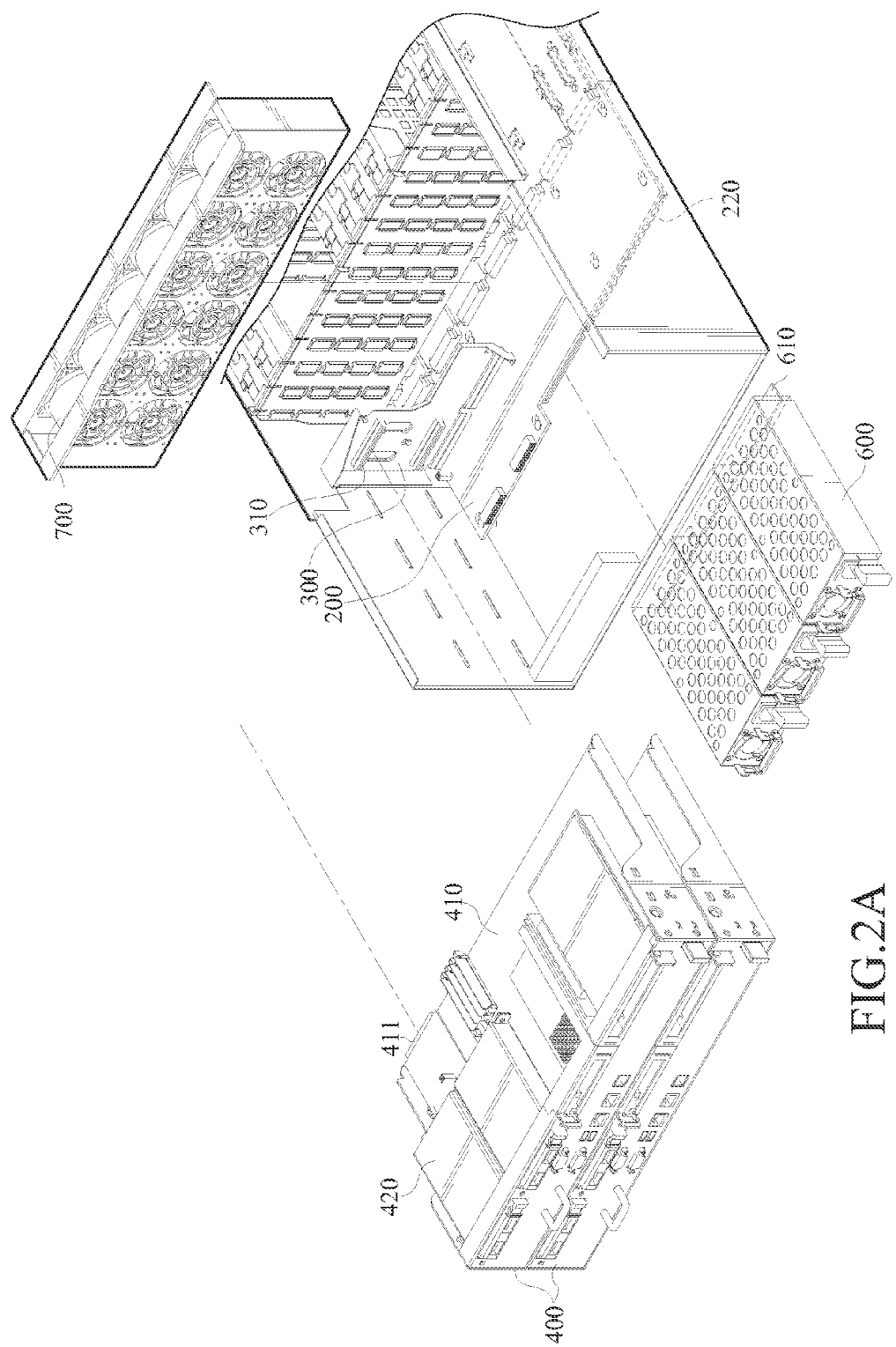
FIG. 2A is a partial exploded view of FIG. 1.
Figure 2B:
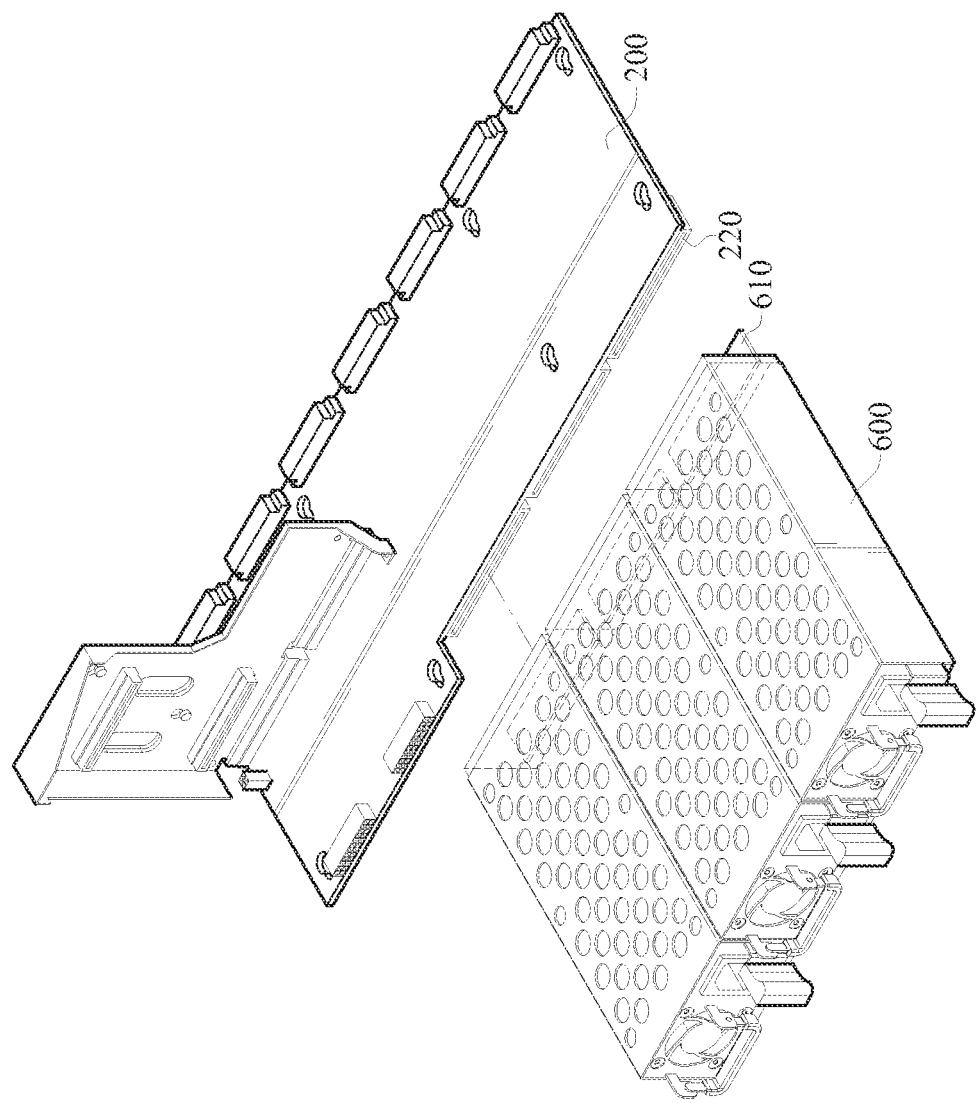
FIG. 2B is an partially enlarged view of FIG. 2A.
Figure 3:
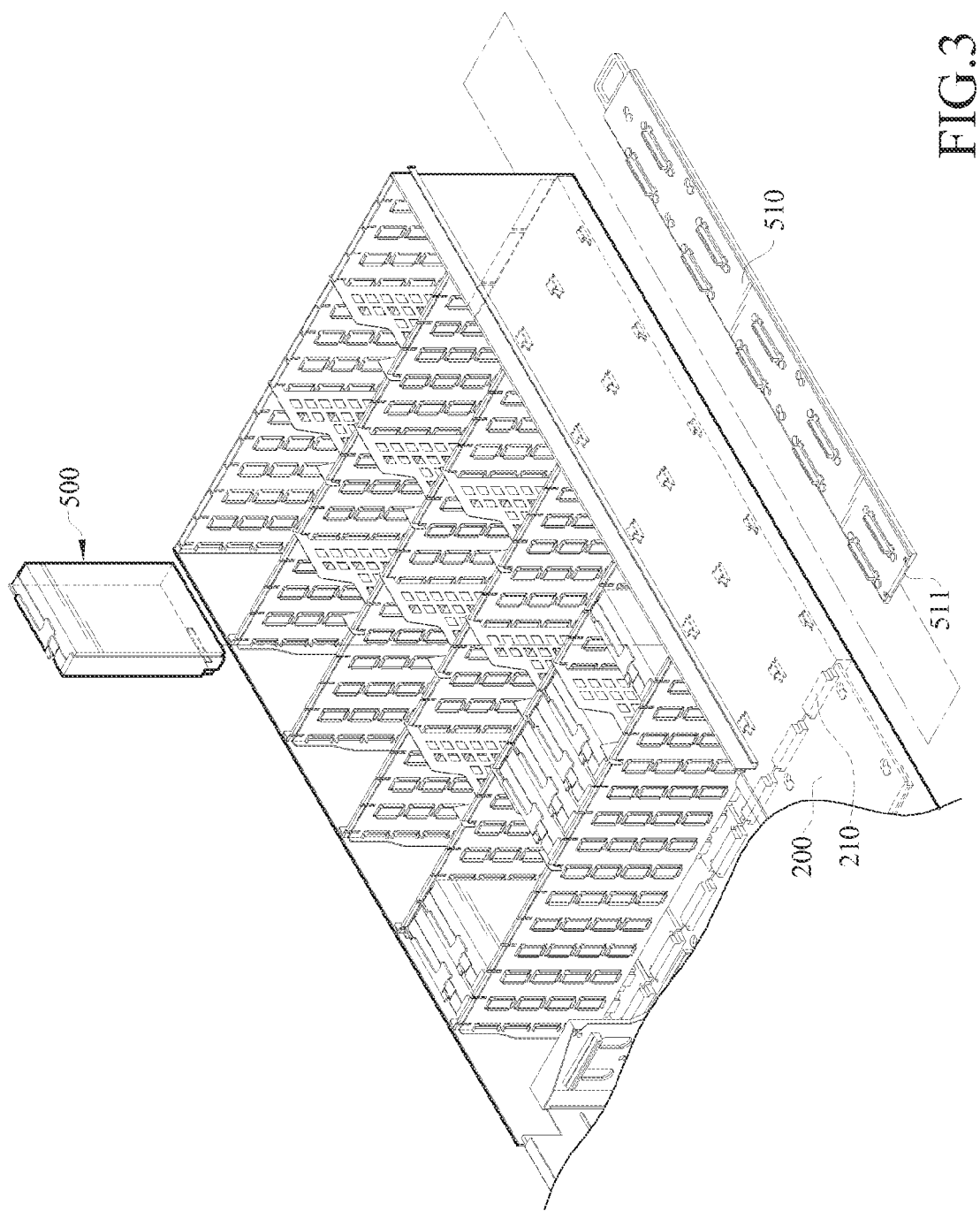
FIG. 3 is a partial exploded view of FIG. 1.

Please refer to FIGS. 1 to 3. FIG. 1 is a schematic view of a server according to an embodiment of the disclosure; FIG. 2A is a partial exploded view of FIG. 1; FIG. 2B is an partially enlarged view of FIG. 2A; and FIG. 3 is a partial exploded view of FIG. 1.

A server 10 of this embodiment comprises a frame 100, a middle plate 200, a vertical plate 300, at least one mainframe 400, a hard disk module 500 and a power supply 600.

More specifically, the frame 100 further comprises a bottom plate 110 and two lateral plates 120 disposed on the two opposite sides of the bottom plate 110. The middle plate 200 lies flat on the bottom plate 110 of the frame 100.

The vertical plate 300 is vertically erected on the middle plate 200. Both the middle plate 200 and the vertical plate 300 are circuit boards. The vertical plate 300 is electrically connected to the middle plate 200. The vertical plate 300 comprises at least one first electrical connector 310. In this embodiment, the quantity of the first electrical connectors 310 is two, one of the two first electrical connectors 310 is disposed above the other first electrical connector 310, but they should not be construed as limitations to the present disclosure. In other embodiments, the quantity of the first electrical connectors 310 can be one or more than three.

Furthermore, in this embodiment, the quantity of the mainframe 400 is two. The two mainframes 400 are disposed inside the frame 100 and between the two lateral plates 120. The two mainframes 400 are stacked together. In other words, the two mainframes 400 are stacked together with one on top and one underneath. The two mainframes 400 are electrically connected to the two first electrical connectors 310 of the vertical plate 300 respectively. That is each of the two mainframes 400 is electrically connected to the vertical plate 300. More specifically, each of the mainframes 400 further comprises a motherboard 410 and a system hard disk 420. Each of the motherboards 410 comprises a second electrical connector 411. The two second electrical connectors 411 are electrically connected to the two first electrical connectors 310 respectively so that the mainframes 400 are electrically connected to the middle plate 200 via the vertical plate 300.

It should be noted that, the relative positions of the mainframes 400 should not be construed as a limitation to the present disclosure. For example, in other embodiments, the mainframes 400 can be arranged next to each other inside the frame 100, and the first electrical connectors 310 are also disposed side by side correspondingly.

Furthermore, in this embodiment, each of the first electrical connectors 310 and each of the second electrical connectors 411 are electrical plug and electrical socket matched with each other. Each of the first electrical connectors 310 is disposed on and electrically connected to the vertical plate 300 directly, and each of the second electrical connectors 411 is disposed on and electrically connected to the motherboard 410 directly. Therefore, the vertical plate 300 and the mainframes 400 can be connected to each other without using cables. Thereby, the assembling time for the vertical plate 300 and the mainframes 400 can be shortened in order to enhance the convenience of assembling the server 10.

In this embodiment, the hard disk module 500 comprises a hard disk back-plate 510 and a plurality of data hard disks 520. The hard disk back-plate 510 can be detachably disposed on and lies flat on the bottom of the frame 100. The detaching direction of the hard disk back-plate 510 is a direction away from the mainframes 400. The hard disk back-plate 510 is an elongated circuit board and the data hard disks 520 are electrically connected to the hard disk back-plate 510. More specifically, the server 10 further comprises a hard disk frame 150. The hard disk frame 150 is disposed on the bottom plate 110 of the frame 100 and between the two lateral plates 120. The data hard disks 520 can be detachably disposed inside the hard disk frame 150 of the frame 100. More specifically, the hard disk frame 150 is used for accommodating the data hard disks 520. The data hard disks 520 can be installed inside the hard disk frame 150 and electrically connected to the hard disk back-plate 510.

In this embodiment, the hard disk back-plate 510 comprises a third electrical connector 511, the middle plate 200 comprises a fourth electrical connector 210, and the fourth electrical connector 210 is disposed on the side of the middle plate 200 near the hard disk back-plate 510. The third electrical connector 511 and the fourth electrical connector 210 are electrically connected to each other. Therefore, the data hard disks 520 can be electrically connected to the mainframes 400 via the hard disk back-plate 510, the middle plate 200 and the vertical plate 300; and therefore, data can be transmitted between the mainframes 400 and the data hard disks 520.

Furthermore, the third electrical connector 511 is disposed on and electrically connected to the hard disk back-plate 510 directly, and the fourth electrical connector 210 is disposed on and electrically connected to the middle plate 200 directly. Therefore, the middle plate 200 and the hard disk back-plate 510 can be connected to each other without using cables. Thereby, the assembling time for the middle plate 200 and the hard disk back-plate 510 can be shortened in order to enhance the convenience of assembling the server 10.

The power supply 600 is disposed on the bottom plate 110 of the frame 100. The power supply 600 is electrically connected to the middle plate 200 and disposed underneath the mainframes 400. Therefore, electric current can be provided by the power supply 600 to each of the mainframes 400 via the middle plate 200 and the vertical plate 300. More specifically, the power supply 600 comprises a fifth electrical connector 610. The middle plate 200 comprises a sixth electrical connector 220. The fifth electrical connector 610 and the sixth electrical connector 220 are electrically connected to each other. Furthermore, the fifth electrical connector 610 is disposed on and electrically connected to a circuit board inside the power supply 600 directly, and the sixth electrical connector 220 is disposed on and electrically connected to the middle plate 200 directly. Therefore, the middle plate 200 and the power supply 600 can be connected to each other without using cables. Thereby, the assembling time for the middle plate 200 and the power supply 600 can be shortened in order to enhance the convenience of assembling the server 10.

Furthermore, in this embodiment, the server 10 further comprises a fan module 700. The fan module 700 comprises a plurality of fans. The fan module 700 is disposed inside the frame 100 and between the two lateral plates 120. The fan module 700 is disposed on the middle plate 200. The fan module 700 is used for heat dissipation of the heating elements inside the server 10. Furthermore, the fan module 700 is electrically connected to middle plate 200 so that the mainframes 400 are electrically connected to the fan module 700 via the middle plate 200. Thereby, the rotating speed of the fan module 700 can be controlled.

Figure 4:
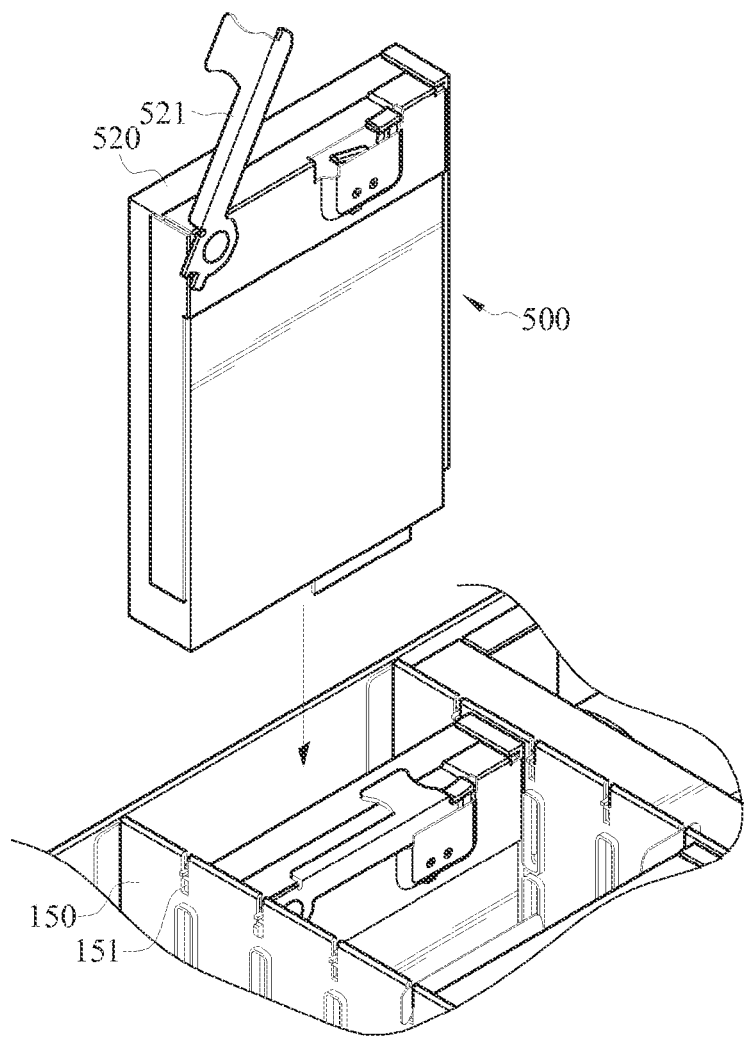
FIGS. 4 and 5 are assembly views of data hard disks and hard disk frame of FIG. 1.
Figure 5:
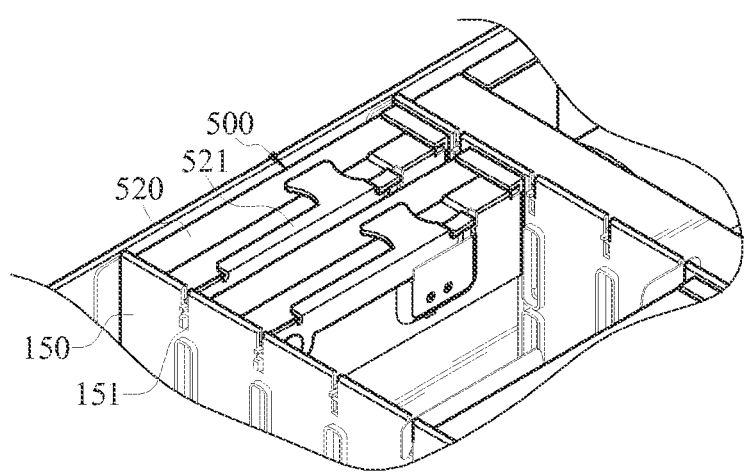

Please refer to FIGS. 4, 5 and 2. FIGS. 4 and 5 are assembly views of the data hard disks and the hard disk frame of FIG. 1.

In this embodiment, the hard disk frame 150 further comprises a fastening hole 151. The server 10 further comprises a plurality of fastening elements 521. Each of the fastening elements 521 is pivotally connected to the corresponding data hard disk 520. Relatively to the data hard disk 520, the fastening element 521 has a releasing position (as shown in FIG. 4) vertically disposed above the data hard disk 520 and a fastening position (as shown in FIG. 5) horizontally disposed on the data hard disk 520. When the fastening element 521 is in the releasing position, the data hard disk 520 can be placed inside the hard disk frame 150. When the data hard disk 520 is disposed inside the hard disk frame 150 and the fastening element 521 is turned to the fastening position, the fastening element 521 is fastened inside the fastening hole 151 to fix the data hard disk 520 inside the hard disk frame 150.

According to the server disclosed in the present disclosure, the mainframes and the vertical plate can be electrically connected to each other, the power supply and the middle plate can be electrically connected to each other, as well as the hard disk back-plate and the middle plate can be electrically connected to each other via the electrical connectors. Thereby, the mainframes and the vertical plate, the power supply and the middle plate, as well as the hard disk back-plate and the middle plate can be electrically connected to each other without using cables. Therefore, the assembling time for the various elements can be shortened in order to enhance the convenience of assembling the server.

Note that the specifications relating to the above embodiments should be construed as exemplary rather than as limitative of the present invention, with many variations and modifications being readily attainable by a person of average skill in the art without departing from the spirit or scope thereof as defined by the appended claims and their legal equivalents.

What is claimed is:

1. A server, comprising:
    a frame comprising a bottom plate and two lateral plates disposed by two opposite sides of the bottom plate;
    a middle plate flatly disposed on the bottom plate and comprising a fourth electrical connector;
    a vertical plate vertically erected on the middle plate and electrically connected to the middle plate, the vertical plate comprising at least one first electrical connector;
    at least one mainframe detachably disposed inside the frame, the at least one mainframe comprising a second electrical connector, the second electrical connector being electrically connected to the first electrical connector;
    a hard disk module detachably disposed inside the frame and electrically connected to the middle plate so that the hard disk module is capable of transmitting data to the mainframe via the middle plate and the vertical plate, the hard disk module comprising a hard disk back-plate and a data hard disk, the data hard disk and the hard disk back-plate being electrically connected to each other, the hard disk back-plate comprises a third electrical connector, and the third electrical connector of the hard disk back-plate and the fourth electrical connector of the middle plate are electrically connected to each other; and
    a power supply detachably disposed inside the frame, the power supply being disposed below the at least one mainframe and electrically connected to the middle plate so that the power supply is capable of transmitting electric current to the mainframe via the middle plate and the vertical plate.

2. The server as claimed in claim 1, wherein the hard disk back-plate is detachably disposed and lie flat on the bottom of the frame, the detaching direction of the hard disk back-plate is a direction away from the mainframe, the data hard disk is detachably inserted on the hard disk back-plate, the detaching direction of the data hard disk is vertical to that of the hard disk back-plate.

3. The server as claimed in claim 1, further comprising a hard disk frame disposed inside the frame, the data hard disk being disposed inside the hard disk frame.

4. The server as claimed in claim 3, wherein the hard disk frame further comprises a fastening hole, the server further comprises a fastening element pivotally connected on the data hard disk, the data hard disk is disposed inside the hard disk frame, and the fastening element is fastened in the fastening hole.

5. The server as claimed in claim 1, wherein the power supply comprises a fifth electrical connector, the middle plate comprises a sixth electrical connector, the fifth electrical connector and the sixth electrical connector are electrically connected to each other.

6. The server as claimed in claim 1, further comprising a fan module disposed inside the frame, the fan module being disposed above the middle plate and electrically connected to the middle plate, the mainframe controlling the fan module via the middle plate, the fan module being disposed between the mainframe and the hard disk module and detached from the frame along a direction away from the middle plate.

7. The server as claimed in claim 1, wherein the at least one mainframe further comprises a motherboard and a system hard disk, the system hard disk is electrically connected to the motherboard, the second electrical connector is disposed on the motherboard.

8. The server as claimed in claim 7, wherein the quantity of the at least one first electrical connector is two, one of the two first electrical connectors is disposed above the other first electrical connector, the quantity of the at least one mainframe is two, the two mainframes are stacked together and electrically connected to the two first electrical connectors respectively.

* * * * *